(12) United States Patent
Lee et al.

(10) Patent No.: US 8,637,876 B2
(45) Date of Patent: Jan. 28, 2014

(54) LIGHT EMITTING DEVICE AND LIGHT EMITTING DEVICE PACKAGE HAVING THE SAME

(75) Inventors: Sang Youl Lee, Seoul (KR); Jung Hyeok Bae, Seoul (KR); Ji Hyung Moon, Seoul (KR); Juno Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/870,911

(22) Filed: Aug. 30, 2010

(65) Prior Publication Data

US 2011/0049537 A1   Mar. 3, 2011

(30) Foreign Application Priority Data

Aug. 31, 2009   (KR) .................. 10-2009-0081112

(51) Int. Cl.
*H01L 29/18*   (2006.01)
*H01L 33/00*   (2010.01)

(52) U.S. Cl.
USPC   257/88; 257/103; 257/E33.001; 257/E33.045; 257/E33.06; 257/E27.121; 438/22; 438/24; 438/26; 438/28; 438/110; 438/128; 438/956; 438/964; 362/249.02; 362/543; 362/545; 362/612; 362/613; 362/800; 315/185 R; 315/246; 313/494; 313/498

(58) Field of Classification Search
USPC .................. 257/88, 103, E33.001, E33.045, 257/E33.046, E33.062, E33.066, E27.121; 438/22, 24, 26, 28, 110, 128, 956, 964; 362/249.02, 543, 545, 612, 613, 800; 315/185 R, 246; 313/496, 498
See application file for complete search history.

(56) References Cited

U.S. PATENT DOCUMENTS

| 7,764,028 | B2 | 7/2010 | Mariyama et al. | |
|---|---|---|---|---|
| 2005/0254243 | A1* | 11/2005 | Jiang et al. | 362/249 |
| 2006/0038190 | A1* | 2/2006 | Park et al. | 257/95 |
| 2008/0087902 | A1* | 4/2008 | Lee et al. | 257/88 |
| 2008/0210954 | A1* | 9/2008 | Lee et al. | 257/88 |
| 2009/0109151 | A1 | 4/2009 | Kim et al. | |

FOREIGN PATENT DOCUMENTS

| KR | 10-2006-0066890 A | 6/2006 |
|---|---|---|
| KR | 10-2006-0078820 A | 7/2006 |
| KR | 10-2009-0043058 A | 5/2009 |
| KR | 10-2009-0079123 A | 7/2009 |
| WO | WO 2009/051376 A2 | 4/2009 |

* cited by examiner

*Primary Examiner* — Meiya Li
(74) *Attorney, Agent, or Firm* — Birch, Stewart, Kolasch & Birch, LLP (57) ABSTRACT

Disclosed are a light emitting device and a light emitting device package having the same. The light emitting device includes a plurality of light emitting cells including a first conductive semiconductor layer, an active layer, and a second conductive semiconductor layer; a first electrode layer connected to the first conductive semiconductor layer of a first light emitting cell of the plural light emitting cells; a plurality of second electrode layers under the light emitting cells, a portion of the second electrode layers being connected to the first conductive semiconductor layer of an adjacent light emitting cells; a third electrode layer disposed under a last light emitting cell of the plural light emitting cells; a first electrode connected to the first electrode layer; a second electrode connected to the third electrode layer; an insulating layer around the first to third electrode layers; and a support member under the insulating layer.

13 Claims, 8 Drawing Sheets

LIGHT EMITTING DEVICE AND LIGHT EMITTING DEVICE PACKAGE HAVING THE SAME

The present application claims priority under 35 U.S.C. §119(a) of Korean Patent Application No. 10-2009-081112 filed on Aug. 31, 2009, which is hereby incorporated by reference in its entirety.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device for AC voltage and a light emitting device package having the same.

The embodiment provides a light emitting device having m light emitting cells ($4 \geq m$) driven with AC voltage and a light emitting device package having the same.

The embodiment provides a light emitting device having m light emitting cells ($4 \geq m$) connected to each other in series and a light emitting device package having the same.

The embodiment provides a light emitting device including a first group having a plurality of light emitting cells connected to each other in series and a second group having a plurality of light emitting cells connected to each other in series, in which the first group is connected parallel to the second group, and a light emitting device package having the same.

A light emitting device according to the embodiment includes a plurality of light emitting cells including a first conductive semiconductor layer, an active layer under the first conductive semiconductor layer, and a second conductive semiconductor layer under the active layer; a first electrode layer connected to the first conductive semiconductor layer of a first light emitting cell of the plural light emitting cells; a plurality of second electrode layers under the light emitting cells, a portion of the second electrode layers being connected to the first conductive semiconductor layer of an adjacent light emitting cells; a third electrode layer under a last light emitting cell of the plural light emitting cells; a first electrode connected to the first electrode layer; a second electrode connected to the third electrode layer; an insulating layer around the first to third electrode layers; and a support member under the insulating layer.

A light emitting device according to the embodiment includes a plurality of light emitting cells including a first conductive semiconductor layer, an active layer under the first conductive semiconductor layer, and a second conductive semiconductor layer under the active layer; a plurality of conductive contact layers under the light emitting cells; a first electrode layer connected to the first conductive semiconductor layer of a first light emitting cell of the plural light emitting cells; a plurality of second electrode layers under the conductive contact layers, a portion of the second electrode layers being connected to the first conductive semiconductor layer of a next light emitting cell of the plural light emitting cells; a third electrode layer under the conductive contact layer disposed under a last light emitting cell of the plural light emitting cells; an electrode connected to a central second electrode layer of the plural second electrode layers; an insulating layer around the first to third electrode layers; and a conductive support member under the insulating layer, the conductive support member being connected to the first and last light emitting cells of the plural light emitting cells.

A light emitting device package according to the embodiment includes a body; a plurality of lead electrodes on the body; a light emitting device connected to the lead electrodes; and a molding member for molding the light emitting device, wherein the light emitting device includes a plurality of light emitting cells including a first conductive semiconductor layer, an active layer under the first conductive semiconductor layer, and a second conductive semiconductor layer under the active layer; a first electrode layer connected to the first conductive semiconductor layer of a first light emitting cell of the plural light emitting cells; a plurality of second electrode layers under the light emitting cells, a portion of the second electrode layers being connected to the first conductive semiconductor layer of an adjacent light emitting cells; a third electrode layer under a last light emitting cell of the plural light emitting cells; a first electrode connected to the first electrode layer; a second electrode connected to the third electrode layer; an insulating layer around the first to third electrode layers; and a support member under the insulating layer.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

Figure 1:
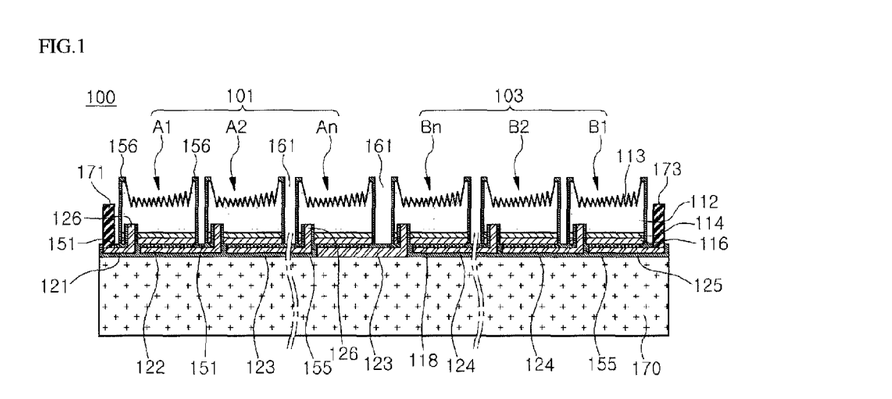
FIG. 1 is a sectional view showing a light emitting device according to the first embodiment.

FIG. 1 is a side sectional view showing a light emitting device according to the first embodiment.

Referring to FIG. 1, the light emitting device 100 includes a plurality of light emitting cells A1 to An and B1 to Bn, a conductive contact layer 118, electrode layers 121 to 125, insulating layers 151, 155 and 156, a first electrode 171, a second electrode 173 and a conductive support member 170.

The light emitting device 100 includes a first group 101 having at least n light emitting cells A1 to An (n≥2) connected to each other in series and a second group 103 having at least n light emitting cells B1 to Bn (n≥2) connected to each other in series.

The light emitting cells A1 to An of the first group 101 and the light emitting cells B1 to Bn of the second group 103 are formed on the conductive support member 170. The light emitting cells A1 to An and B1 to Bn may have the same size or some light emitting cells have different sizes. In addition, the light emitting cells A1 to An and B1 to Bn may have the same upper and lower widths or the upper widths are narrower than the lower widths of the light emitting cells A1 to An and B1 to Bn.

The light emitting cells A1 to An of the first group 101 are connected to the light emitting cells B1 to Bn of the second group 103 in series. The light emitting cells A1 to An and B1 to Bn may have the same size or different sizes, and the embodiment is not limited thereto.

The light emitting cells A1 to An and B1 to Bn can be arrayed in at least one row or in the form of a matrix. In addition, the light emitting cells A1 to An and B1 to Bn of the first and second groups 101 and 103 may be driven under one driving mode or one operational period of AC power.

The light emitting cells A1 to An and B1 to Bn of the first and second groups 101 and 103 may include a plurality of semiconductor layers including the group III-V compound semiconductors. For instance, the light emitting cells A1 to An and B1 to Bn may include a first conductive semiconductor layer 112, an active layer 114 under the first conductive semiconductor layer 112, and a second conductive semiconductor layer 116 under the active layer 114.

For instance, the light emitting cells A1 to An and B1 to Bn may include GaN, AlN, AlGaN, InGaN, InN, InAlGaN, AlInN, AlGaAs, GaP, GaAs, GaAsP, or AlGaInP. If the first conductive semiconductor layer is an N type semiconductor layer, the second conductive semiconductor layer is a P type semiconductor layer.

The first conductive semiconductor layer 112 is formed on the active layer 114. The first conductive semiconductor layer 112 may have thickness larger than that of the second conductive semiconductor layer 116. If the first conductive semiconductor layer 112 is the N type semiconductor layer, the first conductive semiconductor layer 112 is doped with N type dopant, such as Si, Ge, Sn, Se, or Te. A roughness 113 can be formed on the top surface of the first conductive semiconductor layer 112. The roughness 113 may include a concave-convex pattern. The roughness 113 can improve the external quantum efficiency. In addition, since the electrode is not formed on the top surfaces of the light emitting cells A1 to An and B1 to Bn, reduction of the external quantum efficiency caused by the electrode can be prevented.

A transmissive layer can be formed on the top surface of the first conductive semiconductor layer 112. The transmissive layer includes material having a refractive index lower than that of the first conductive semiconductor layer 112. For instance, the transmissive layer may include insulating material and/or a transparent electrode layer, such as TCO (Transparent conductive oxide).

The active layer 114 is interposed between the first and second conductive semiconductor layers 112 and 117 to emit the light having a predetermined wavelength band. The active layer 114 may have a single quantum well structure, a multiple quantum well structure, a quantum wire structure, or a quantum dot structure. The active layer 114 may have a stack structure of a well layer/a barrier layer, such as InGaN/GaN, GaN/AlGaN, InGaN/InGaN, but the embodiment is not limited thereto. The well layer may have a band gap lower than that of the barrier layer.

A first conductive clad layer (not shown) may be formed between the active layer 114 and the first conductive semiconductor layer 112. The first conductive clad layer may include a GaN-based semiconductor and have a band gap higher than that of the active layer 114.

A second conductive clad layer (not shown) may be formed between the active layer 114 and the second conductive semiconductor layer 116. The second conductive clad layer may include a GaN-based semiconductor and have a band gap higher than that of the active layer 114.

The second conductive semiconductor layer 116 is disposed under the active layer 114. The second conductive semiconductor layer 116 includes the compound semiconductor doped with the second conductive dopant. For instance, the second conductive semiconductor layer 116 may include at least one selected from the group consisting of GaN, InN, AlN, InGaN, AlGaN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr or Ba.

A third conductive semiconductor layer (not shown) can be formed under the second conductive semiconductor layer 116. The third conductive semiconductor layer may include a semiconductor layer, which has polarity opposite to that of the second conductive semiconductor layer. The third conductive semiconductor layer may include the semiconductor having polarity identical to that of the first conductive semiconductor layer. Thus, the light emitting cells A1 to An and B1 to Bn may have one of an N-P junction structure, a P-N junction structure, an N-P-N junction structure, and a P-N-P junction structure. For the purpose of convenience, the lowest layer of the light emitting cells will be referred to as the second conductive semiconductor layer 116.

In addition, a stepped portion, which exposes the first conductive semiconductor layer 112 and a part of the top surface of the second conductive semiconductor layer 116, is not formed in the light emitting cells A1 to An and B1 to Bn.

The second conductive semiconductor layer 116 is formed under the active layer 114 and can be doped with the P type dopant, such as Mg, Be or Zn. The second conductive semiconductor layer 116 or the third conductive semiconductor layer can be disposed at the lowest layer of the light emitting cells A1 to An and B1 to Bn. For the purpose of convenience, the lowest layer of the light emitting cells will be referred to as the second conductive semiconductor layer 116.

The light emitting cells A1 to An and B1 to Bn can be spaced apart from each other by spacers 161. The spacer 161 interposed between the first and second groups 101 and 103 may have a width equal to or different from a width between light emitting cells.

The conductive contact layer 118 is formed under the second conductive semiconductor layer 116 of the light emitting cells A1 to An and B1 to Bn and the electrode layers 121 to 125 are formed under the conductive contact layer 118. The conductive contact layer 118 includes an ohmic contact layer. The conductive contact layer 118 may come into ohmic contact with a lower surface of the second conductive semiconductor layer 116. The conductive contact layer 118 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, Ni/IrOx/Au/ITO, TCO (Transparent conductive oxide) and TCN (transparent conductive nitride).

The conductive contact layer 118 may include a plurality of patterns in which a low conductive layer (not shown) can be formed between patterns. The low conductive layer can be interposed between the patterns of the conductive contact layer 118 by using material, such as insulating material having conductivity lower than that of the conductive contact layer 118. A number of the conductive contact layer 118 is identical to a number of the light emitting cells A1 to An and B1 to Bn.

The electrode layers 121 to 125 include one selected from the group consisting of Ag, Ni, Al, Rh, Pd, Ir, Ru, Mg, Zn, Pt, Au, Hf, W, Ti and combination thereof. The electrode layers 121 to 125 can be prepared as a single layer or a multiple layer. The electrode layers 121 to 125 may serve as reflective electrode layers having electric ohmic contact functions with high reflectivity (50% or above).

At least one of the electrode layers 121 to 125 is partially or fully disposed under the light emitting cells A1 to An and B1 to Bn.

The first electrode layer 121 is disposed under the first light emitting cell A1 aligned at one side of the first group 101. Part 126 of the first electrode layer 121 makes contact with the first conductive semiconductor layer 112 through the conductive contact layer 118, the second conductive semiconductor layer 116 and the active layer 114. The first electrode layer 121 may include ohmic contact material at the contact part between the first electrode layer 121 and the first conductive semiconductor layer 112, but the embodiment is not limited thereto.

Figure 1A:
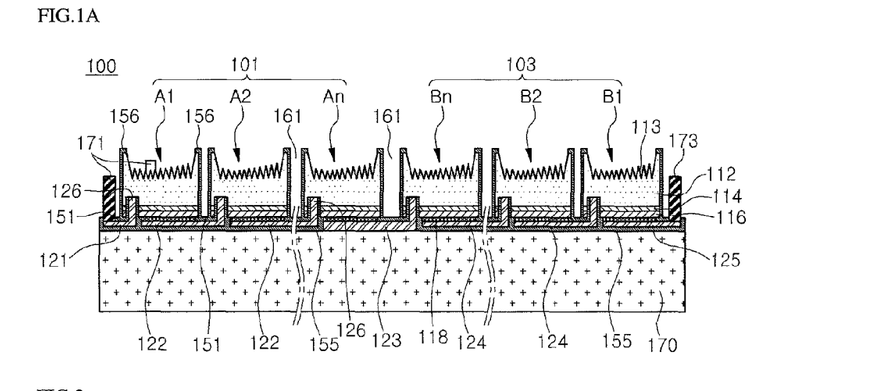
FIG. 1A is a sectional view showing a light emitting device according to a second embodiment.

One side of the first electrode layer 121 extends outward beyond the first light emitting cell A1 of the first group 101 and the first electrode 171 is electrically connected onto one side of the first electrode layer 121. The first electrode layer 121 may serve as a first pad, and can be formed on one side of the first electrode layer 121. In addition, the first electrode 171 is formed on the first conductive semiconductor layer 112 of the first light emitting cell A1, as depicted in FIG. 1A.

The second to fifth electrode layers 122 to 125 are disposed under the light emitting cells A1 to An and B1 to Bn to serve as reflective layers. The second to fifth electrode layers 122 to 125 make contact with the conductive contact layer 118 disposed under the light emitting cells A1 to An and B1 to Bn.

Parts 126 of the second to fourth electrode layers 122 to 124 make contact with the first conductive semiconductor layer 112 of the next light emitting cell. The second to fourth electrode layers 122 to 124 connect two adjacent light emitting cells in series.

The third electrode layer 123 electrically connects the first and second groups 101 and 103 with each other. In detail, the third electrode layer 123 electrically connects the light emitting cell An of the first group 101 with the light emitting cell Bn of the second group 103 in series.

The fifth electrode layer 125 makes contact with the conductive contact layer 118 disposed under the first light emitting cell B1 of the second group 103 and the other end of the fifth electrode layer 125 extends to the other end of the first light emitting cell B1. The second electrode 173 is electrically connected to the other side of the fifth electrode layer 125. The second electrode 173 is electrically connected to the other end of the fifth electrode layer 125. The second electrode 173 serves as a pad and is disposed on the other side of the fifth electrode layer 125.

The first electrode 171 is opposite to or parallel to the second electrode 173 about the center of the light emitting device 100, but the embodiment is not limited thereto. The power applied to the first electrode 171 may have polarity opposite to that of the power applied to the second electrode 173.

The first insulating layer 151 is formed on the first to fifth electrode layers 121 to 125 to block the undesired contact among the first to fifth electrode layers 121 to 125, the light emitting cells A1 to An and B1 to Bn and the conductive contact layer 118.

The second insulating layer 155 is interposed between the first to fifth electrode layers 121 to 125 and the conductive support member 170 to block the undesired contact between the conductive support member 170 and the first to fifth electrode layers 121 to 125. In addition, a part of the second insulating layer 155 prevents the ohmic contact layer 118 of one light emitting cell from making contact with the electrode layer of another light emitting cell.

The third electrode layer 123 makes contact with an nth light emitting cell An of the first group 101, an nth light emitting cell Bn of the second group 103, and the conductive support member 170.

AC power can be supplied to the third electrode layer 123 and the second electrode 173, respectively, at the interval of half operational period such that the first and second groups 101 and 103 can be alternately operated at the interval of half operational period.

The light emitting cells A1 to An of the first group 101 are connected to the light emitting cells B1 to Bn of the second group 103 in series. The first electrode 171 is connected to the first light emitting cell A1 of the first group 101, the conductive support member 170 is connected to the nth light emitting cell An, the second electrode 173 is connected to the first light emitting cell B1 of the second group 103, and the conductive support member 170 is connected to the nth light emitting cell Bn.

The conductive support member 170 supports the light emitting device and includes at least one selected from the group consisting of Cu, Au, Ni, Mo, Cu—W, Pd, In, W, Si, Ta, Nb, and carrier wafer such as Si, Ge, GaAs, ZnO, GaN, $Ge_2O_3$, or SiC.

The conductive support member 170 may have heat sink and conductive characteristics.

The conductive support member 170 can be coated or attached in the form of a sheet, but the embodiment is not limited thereto. The conductive support member 170 may have a thickness of about 30~500 μm, but the embodiment is not limited thereto.

A bonding layer can be interposed between the conductive support member 170 and the third electrode layer 123. The bonding layer may include at least one of Ti, Cr, Ta, and an alloy thereof.

The third insulating layer 156 is formed around the light emitting cells A1 to An and B1 to Bn to prevent the short between layers and cells. In addition, the third insulating layer 156 may cover the upper portion of the light emitting cells A1 to An and B1 to Bn.

The first to third insulating layers 151, 155 and 156 include insulating material, such as $SiO_2$, $Si_3N_4$, $Al_2O_3$, or $TiO_2$.

During the half operational period of the AC power, positive power is applied to the conductive support member 170 so that the current flows to the first electrode 171 through the nth to first light emitting cells An to A1 of the first group 101. Thus, the light emitting cells A1 to An of the first group 101 may emit the light.

During the next half operational period of the AC power, negative power is applied to the second electrode 173 so that the current flows to the conductive support member 170 through the nth to first light emitting cells Bn to B1 of the second group 103. Thus, the light emitting cells B1 to Bn of the second group 103 may emit the light.

The level of the AC power applied to the light emitting device 100 may correspond to the sum of the driving voltage of the light emitting cells An to A1 and Bn to B1. For instance, about 60 light emitting cells having the driving voltage of about 3.5V can be connected to each other in series under the AC voltage of 220V. That is, under the AC voltage of 220V is applied, 30 light emitting cells A1 to An of the first group 101 are connected to each other in series and 30 light emitting cells B1 to Bn of the second group 103 are connected to each other in series. Thus, 60 light emitting cells are connected to each other in series. In addition, under the AC voltage of 110V, 30 light emitting cells having the driving voltage of about 3.5V can be connected to each other in series.

The driving voltage of the light emitting cells A1 to An and B1 to Bn is changeable so that the number of light emitting cells is also changeable. In addition, the light emitting device 100 can be operated without an additional rectifier. The number of light emitting cells of the first group 101 may be identical to or different from the number of light emitting cells of the second group 103 according to the level of the positive voltage and the negative voltage under the AC power condition.

According to the embodiment, the light emitting cells A1 to An and B1 to Bn of at least two groups 101 and 103 having operational periods different from each other are formed on one conductive support member, so that the size of the light emitting device can be minimized and the circuit of the light emitting device for the AC power can be simplified. In addition, the first group 101 can be connected to the second group 103 of the light emitting device without using an additional wire.

Further, since the light emitting cells A1 to An and B1 to Bn can be connected to each other through the electrode layers 121 to 125 disposed under the light emitting cells A1 to An and B1 to Bn, it is not necessary to provide metal on the light emitting cells A1 to An and B1 to Bn.

The first and second groups 101 and 103 of the light emitting device 100 can be prepared in the form of bars. In addition, the first and second groups 101 and 103 can be parallel to each other or can be bent by at least one time. If the first and second groups 101 and 103 are parallel to each other, the first electrode layer 121 can be electrically connected to the fifth electrode layer 125. In this case, one of the first and second electrodes 171 and 173 can be omitted.

Figure 2:
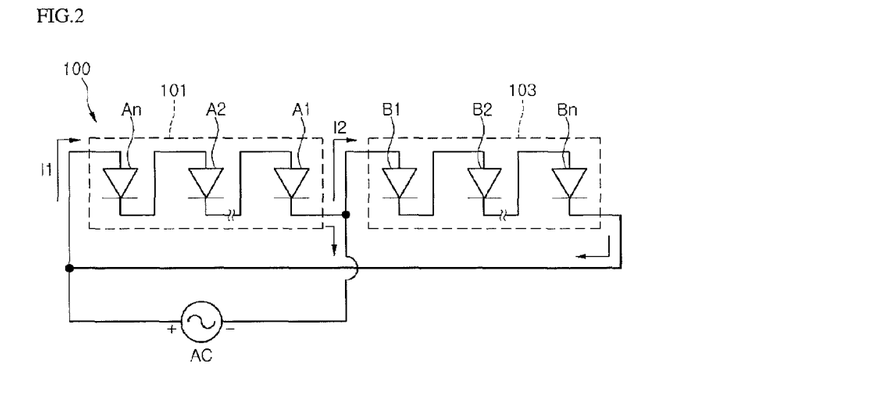
FIG. 2 is a circuit view showing an AC driving circuit of a light emitting device shown in FIG. 1.

FIG. 2 is a circuit view showing a driving circuit of the light emitting device shown in FIG. 1.

Referring to FIG. 2, positive current I1 of AC power is applied to the first group 101 for the half operational period to sequentially drive the light emitting cells of the first group 101 from the nth light emitting cell An to the first light emitting cell A1. In addition, negative current I2 of AC power is applied to the second group 103 for the remaining half operational period to sequentially drive the light emitting cells of the second group 103 from the nth light emitting cell Bn to the first light emitting cell B1. In this manner, the light emitting cells A1 to An and B1 to Bn of the first and second groups 101 and 103 can be alternately turned on/off during one operational period of the AC power.

A resistor and a rectifier circuit can be provided between the AC power terminal and the light emitting device, and the embodiment is not limited thereto. In addition, the light emitting device 100 can drive the first group 101 separately from the second group 103.

FIGS. 3 to 12 are sectional views showing the method for manufacturing the light emitting device shown in FIG. 1. In the following description, the manufacturing process for the first group of the light emitting device will be explained with reference to a plurality of light emitting cells and the method for manufacturing the second group will be omitted in order to avoid redundancy.

Figure 3:
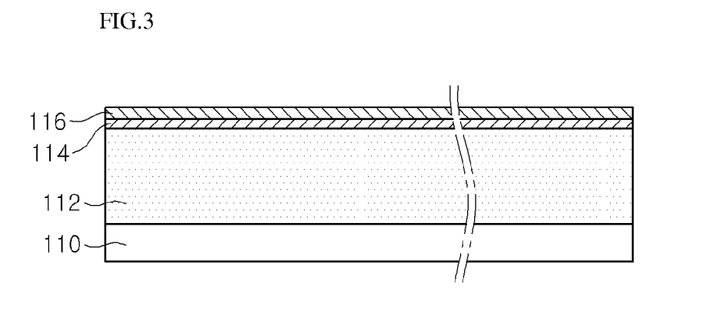
FIGS. 3 to 12 are sectional views showing the procedure for manufacturing a light emitting device shown in FIG. 1.

Referring to FIG. 3, the substrate 110 is loaded into growth equipment and a group II to VI compound semiconductor is formed on the substrate 110 in the form of a layer or a pattern.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the growth equipment.

The substrate 110 may include an insulating substrate or a conductive substrate. For instance, the substrate 110 may include one selected from the group consisting of $Al_2O_3$, GaN, SiC, ZnO, Si, GaP, InP, $Ga_2O_3$, and GaAs. A concave-convex pattern can be formed on the top surface of the substrate 110.

In addition, a layer or a pattern including a group II to VI compound semiconductor can be formed on the substrate 110. For instance, at least one of a ZnO layer (not shown), a buffer layer (not shown) and an undoped semiconductor layer (not shown) can be formed on the substrate 110. The buffer layer or the undoped semiconductor layer can be formed by using the group III-V compound semiconductor. The buffer layer may reduce the lattice constant difference relative to the substrate, and the undoped semiconductor layer may include an undoped GaN-based semiconductor. For the purpose of convenience, the following description will be made on the assumption that the first conductive semiconductor layer 112 is formed on the substrate 110.

A plurality of compound semiconductors are formed on the substrate 110 for the light emitting cells. The first conductive semiconductor layer 112 is formed on the substrate 110, the active layer 114 is formed on the first conductive semiconductor layer 112, and the second conductive semiconductor layer 116 is formed on the active layer 1140.

The first conductive semiconductor layer 112 may include a group III-V compound semiconductor doped with a first conductive dopant. For instance, the first conductive semiconductor layer 112 may include one selected from the group consisting of GaN, AlN, AlGaN, InGaN, InN, InAlGaN, AlInN, AlGaAs, GaP, GaAs, GaAsP and AlGaInP. If the first conductive semiconductor layer 112 is an N type semiconductor layer, the first conductive dopant is an N type dopant, such as Si, Ge, Sn, Se, or Te. The first conductive semiconductor layer 112 may have a single layer structure or a multi-layer structure, but the embodiment is not limited thereto.

The active layer 114 is disposed on the first conductive semiconductor layer 112. The active layer 114 may have a single quantum well structure, a multiple quantum well structure, a quantum dot structure or a quantum wire structure. The active layer 114 may have a stack structure including a well layer and a barrier layer, such as an InGaN well layer/GaN barrier layer, a GaN well layer/AlGaN barrier layer, or an InGaN well layer/InGaN barrier layer. This stack structure may include 2-30 pairs of the well/barrier layers, but the embodiment is not limited thereto. The well layer may include material having band gap lower than that of the barrier layer.

A first conductive clad layer (not shown) may be formed between the active layer 114 and the first conductive semiconductor layer 112. The first conductive clad layer may include a GaN-based semiconductor and have a band gap higher than that of the active layer 114.

A second conductive clad layer (not shown) may be formed between the active layer 114 and the second conductive semiconductor layer 116. The second conductive clad layer may include a GaN-based semiconductor and have a band gap higher than that of the active layer 114. The second conductive semiconductor layer 116 is formed on the active layer 114.

The second conductive semiconductor layer 116 includes the group III-V compound semiconductor doped with the second conductive dopant. For instance, the second conductive semiconductor layer 116 may include at least one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba.

In addition, a third conductive semiconductor layer can be formed on the second conducive semiconductor layer 116. The third conductive semiconductor layer may include a semiconductor having polarity opposite to that of the second conductive semiconductor layer or identical to that of the first conductive semiconductor layer.

The stack structure of the first conductive semiconductor layer 112, the active layer 114 and the second conductive semiconductor layer 116 may constitute the light emitting cell areas. In addition, the light emitting cell may include at least one of an N-P junction structure, a P-N junction structure, an N-P-N junction structure, and a P-N-P junction structure.

Figure 4:
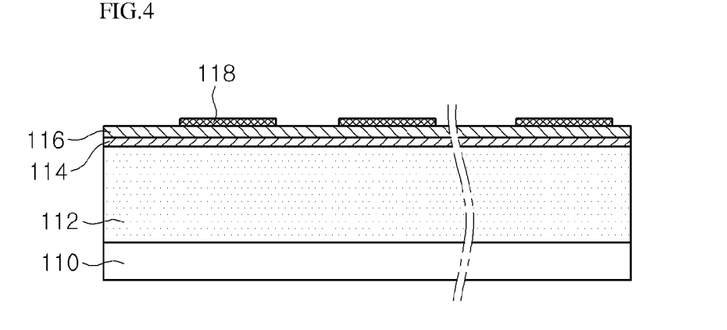

Referring to FIG. 4, a plurality of conductive contact layers 118 are formed on the second conductive semiconductor layer 116. The conductive contact layers 118 are spaced apart from each other by a regular interval. The ohmic contact layers 118 have widths corresponding to a width of the each light emitting cell areas.

The ohmic contact layers 118 are formed on a part of the top surface of the second conductive semiconductor layer 116 while making ohmic contact with the second conductive semiconductor layer 116. The ohmic contact layers 118 may include transmissive conductive material. For instance, the ohmic contact layers 118 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO.

The ohmic contact layers 118 can be prepared in the form of layers or patterns. The layers or patterns may change ohmic resistance relative to the second conductive semiconductor layer 116.

Figure 5:
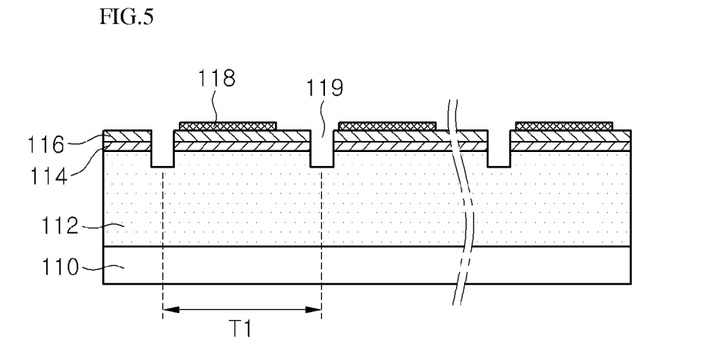

Referring to FIG. 5, a plurality of recesses 119 are formed. The recesses 119 have a depth from the second conductive semiconductor layer 116 to the top surface of the first conductive semiconductor layer 112. An interval T1 between the recesses 119 is predetermined. For instance, the interval T1 corresponds to a part of each electrode layer. The ohmic contact layers 118 are formed on the top surface of the second conductive semiconductor layer 116, which are divided into several parts by the recesses 119.

The sequence of forming the recesses 119 and the ohmic contact layers 118 may be changeable, and the embodiment is not limited thereto.

Figure 6:
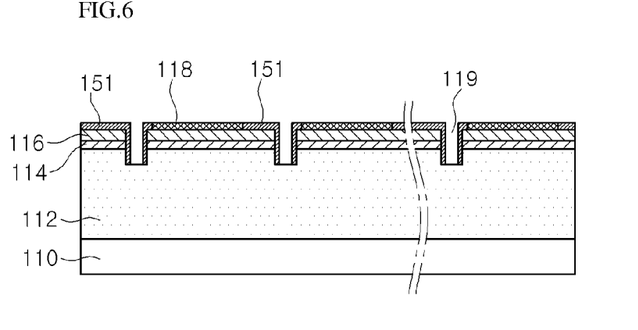

Referring to FIG. 6, the first insulating layer 151 is formed on a predetermined region of the top surface of the second conductive semiconductor layer 116 where the ohmic contact layers 118 are not formed. For instance, after forming a mask layer, the first insulating layer 151 is formed on a region where the mask layer is not formed through a lithography process. That is, the first insulating layer 151 can be formed on the top surface of the second conductive semiconductor layer 116 having no ohmic contact layers 118 and in the recesses 119. The first conductive semiconductor layer 112 is exposed through the first insulating layer 151 formed in the recesses 119.

Figure 7:
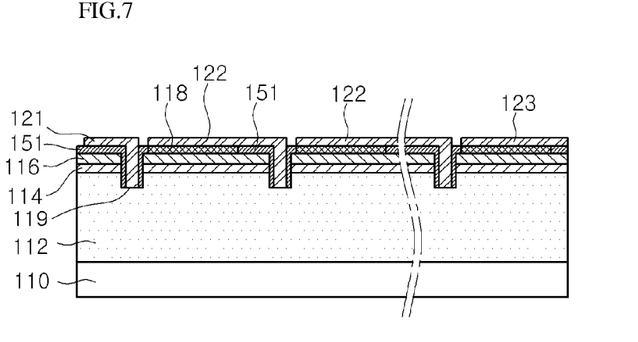
Figure 8:
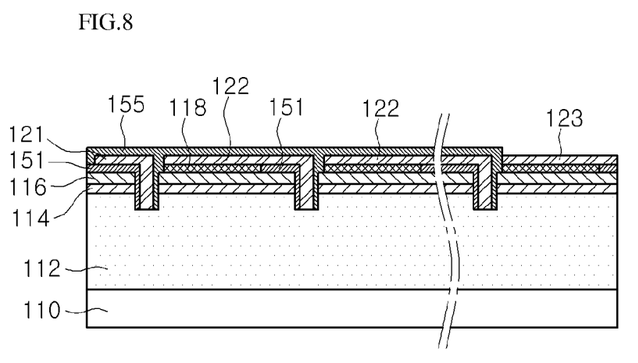

Referring to FIGS. 7 and 8, the electrode layers 121, 122 and 123 are formed on the first insulating layer 151 and the ohmic contact layers 118.

The electrode layers 121, 122 and 123 are physically spaced apart from each other and serve as reflective electrode layers. The electrode layers 121, 122 and 123 may include material selected from the group consisting of Ag, Ni, Al, Rh, Pd, Ir, Ru, Mg, Zn, Pt, Au, Hf, W, Ti and combination thereof.

The first electrode layer 121 is formed on the first insulating layer 151 and partially makes contact with the first conductive semiconductor layer 112 through the recesses 119. The second electrode layer 122 is formed on the first insulating layer 151 and the ohmic contact layers 118 and partially makes contact with the first conductive semiconductor layer 112 through the recesses 119. In addition, a plurality of electrode layers 121, 122 and 123 can be provided to make contact with the first conductive semiconductor layer 112.

The third electrode layer 123 is formed on the ohmic contact layers 118 and the first insulating layer 151. In FIG. 1, the third electrode layer 123 is positioned corresponding to the third electrode layer 123 at the center of the light emitting device.

The second and third electrode layers 122 and 123 are positioned corresponding to the light emitting cells, respectively. In addition, as shown in FIG. 1, the second and third electrode layers 122 and 123 connect adjacent light emitting cells in series.

Referring to FIG. 8, the second electrode layer 155 is formed on the first and second electrode layers 121 and 122. The top surface of the third electrode layer 123 is open.

The first and second insulating layers 151 and 155 may include material selected from the group consisting of $SiO_2$, $Si_3N_4$, $Al_2O_3$, and $TiO_2$.

Figure 9:
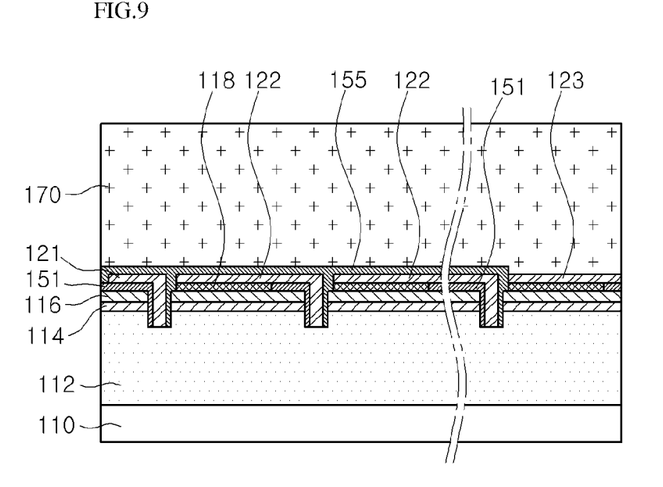

Referring to FIG. 9, a conductive support member 170 is formed on the second insulating layer 155 and the third electrode layer 123. The conductive support member 170 supports the light emitting device and includes at least one selected from the group consisting of Cu, Au, Ni, Mo, Cu—W, Pd, In, W, Si, Ta, Nb, and a carrier wafer such as Si, Ge, GaAs, ZnO, SiC, SiGe, $Ga_2O_3$ or GaN.

The conductive support member 170 may have heat sink and conductive characteristics. The conductive support member 170 can be coated or attached in the form of a sheet, but the embodiment is not limited thereto. The conductive support member 170 may have a thickness of about 30~500 μm, but the embodiment is not limited thereto.

A bonding layer can be interposed between the conductive support member 170 and the third electrode layer 123. The bonding layer may include at least one of Ti, Cr, Ta, and an alloy thereof.

Figure 10:
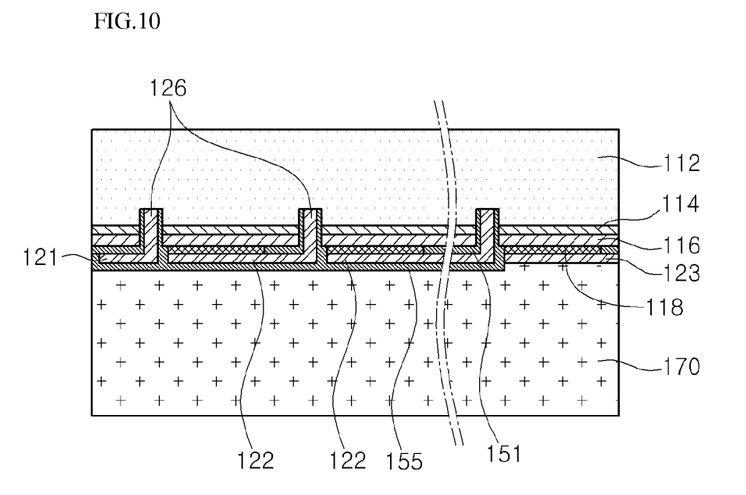

Referring to FIGS. 9 and 10, after the conductive support member 170 has been positioned on the base, the substrate 110 is removed through a physical/chemical scheme.

In order to remove the substrate 110, the physical and/or chemical scheme can be employed. The physical scheme includes a laser lift off (LLO) scheme, in which a laser beam having a predetermined wavelength band is irradiated onto the substrate 110, so that the substrate 110 is separated from the first conductive semiconductor layer 112. The chemical scheme includes a wet etching scheme, in which the semiconductor layer (for instance, the buffer layer) formed between the substrate 110 and the first conductive semiconductor layer 112 is removed through the wet etching process, so that the substrate 110 is separated.

After the substrate 110 has been removed, an inductively coupled plasma/reactive ion etching (ICP/RIE) process can be performed with respect to the surface of the first conductive semiconductor layer 112.

The ohmic contact layers 118 and the first to third electrode layers 121, 122 and 123 are disposed under the second conductive semiconductor layer 116 so that they are protected from external impact. That is, the ohmic contact layers 118 and the first to third electrode layers 121, 122 and 123 are protected from external impact when the substrate 110 is removed.

Figure 11:
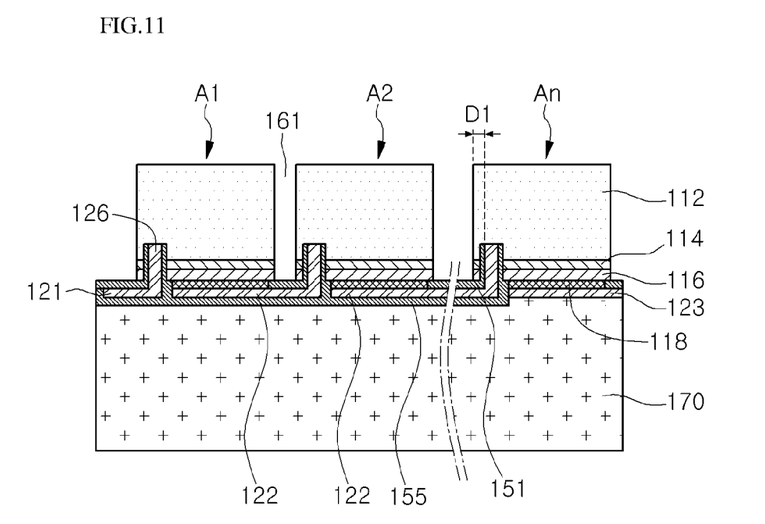

Referring to FIG. 11, the etching process is performed to form the spacers 161 for the light emitting cells A1 to An. The etching process is continued until the first insulating layer 151 disposed under the second conductive semiconductor layer 116 is exposed. Thus, the light emitting cells A1 to An may be separated from each other. Each light emitting cell may be spaced apart from the part 126 of the electrode layers 121, 122 and 123 by a predetermined distance D1. If the distance D1 is enlarged, an ohmic contact layer can be further formed. In addition, the first insulating layer 151 may be exposed to the outer sides of the light emitting cells A1 to An, but the embodiment is not limited thereto.

The spacers 161 formed among the light emitting cells A1 to An may have widths identical to or different from each other, and the embodiment is not limited thereto. When viewed from the top, the light emitting cells A1 to An may have a circular shape of a polygonal shape, such as a rectangular shape or a square shape.

The part 126 of the first electrode layer 121 is connected to the first conductive semiconductor layer 112 of the first light emitting cell A1. The second electrode layer 122 is connected to the ohmic contact layer 118 disposed under the first light emitting cell 118 and the part 126 of the second electrode layer 122 is connected to the first conductive semiconductor layer 112 of the second light emitting cell A2. In this manner, the second electrode layer 122 connects two adjacent light emitting cells in series.

The third electrode layer 123 is connected to the ohmic contact layer 118 and the conductive support member 170 disposed under the nth light emitting cell An. In this manner n light emitting cells A1 to An can be connected to each other in series.

Figure 12:
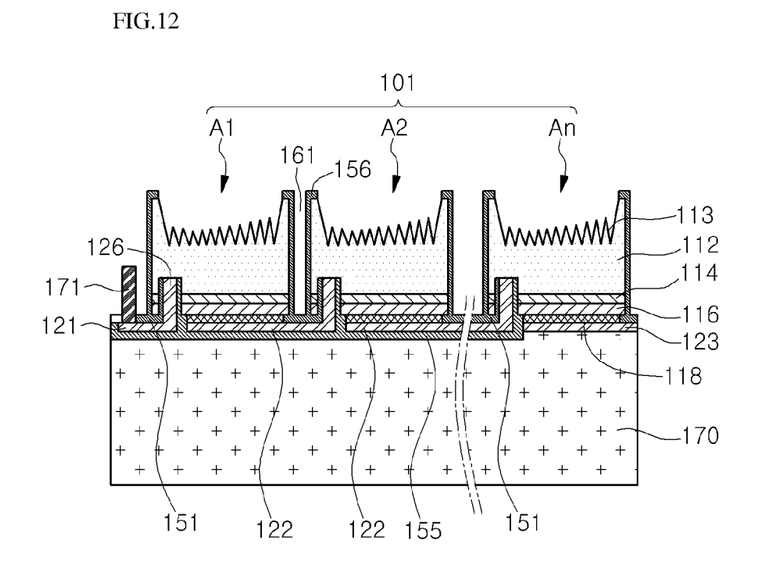

Referring to FIG. 12, the roughness 113 is formed on the top surface of the first conductive semiconductor layer 112 of the light emitting cells A1 to An. The roughness 113 can be prepared in the form of a concave-convex pattern through the dry and/or wet etching process. In addition, the roughness 113 may include an additional concave-convex structure. The roughness 113 can improve the external quantum efficiency.

The first insulating layer 151 is partially exposed out of the first light emitting cell A1. A part of the first insulating layer 151 is open through the etching process. In this case, the first electrode layer 121 may be exposed. The first electrode 171 is formed on the first electrode layer 121. The first electrode 171 may include a pad.

The N light emitting cells A1 to An are connected with each other in series between the first electrode 171 and the conductive support member 170. Thus, the light emitting device as shown in FIG. 1 is obtained through the manufacturing processes.

The embodiment can provide the light emitting device including the light emitting cells of the first and second groups, which can be driven under the AC power, so that additional parts may not be necessary even if the AC power is used and the light extraction efficiency can be improved.

Figure 13:
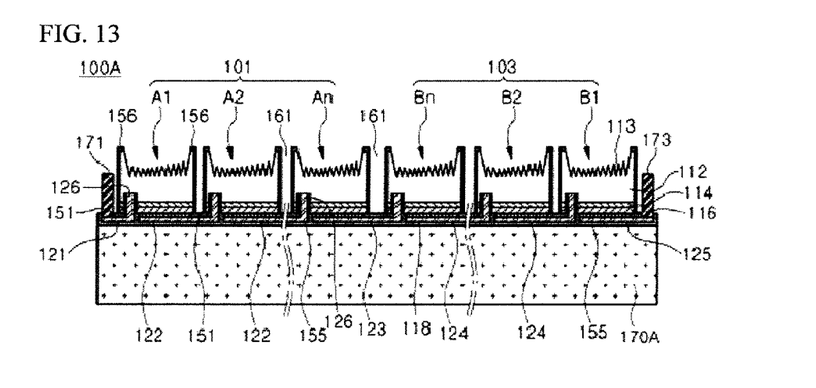
FIG. 13 is a sectional view showing a light emitting device according to the second embodiment.

FIG. 13 is a side sectional view showing a light emitting device according to the second embodiment. In the following description, the elements and structures that have already been explained in the first embodiment will be omitted in order to avoid redundancy.

Referring to FIG. 13, the light emitting device 100A includes the second insulting layer 155 provided between the third electrode layer 123 formed at the center of the light emitting device 100A and the support member 170A. The support member 170A includes material having the heat sink and insulating characteristics, so that the support member 170A can effectively dissipate the heat. The support member 170A is formed of a conductive metal, but the embodiment is not limited thereto.

The light emitting cells A1 to An and Bn to B1 are connected to each other in series between the first electrode 171 and the second electrode 173 provided at both ends of the light emitting device 100A, so that the light emitting device 100A can emit the light during the half operational period of the AC power. In this case, two light emitting devices 100A is aligned in parallel to each other such that they can be driven under the AC power.

Figure 14:
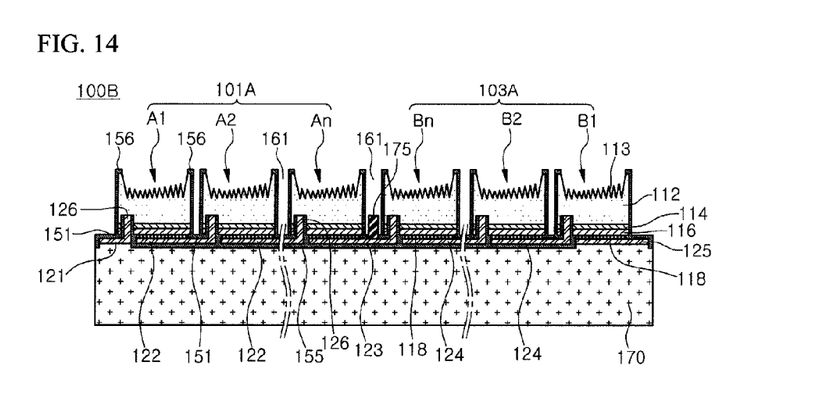
FIG. 14 is a sectional view showing a light emitting device according to the third embodiment.

FIG. 14 is a side sectional view showing a light emitting device according to the third embodiment. In the following description, the elements and structures that have already been explained in the first embodiment will be omitted in order to avoid redundancy.

Referring to FIG. 14, the light emitting device 100B includes the second insulting layer 155 provided between the third electrode layer 123 formed at the center of the light emitting device 100B and the support member 170.

The third electrode 175 can be formed in the spacer 161 aligned between the first and second groups 101A and 103A. The third electrode 175 is formed on the third electrode layer 123 and connected to the nth light emitting cell An of the first group 101a and the nth light emitting cell Bn of the second group 103a through the third electrode layer 123.

The first electrode layer 121 disposed under the first light emitting cell A1 of the first group 101A is connected to the support member 170 and the fifth electrode layer 125 disposed under the first light emitting cell B1 of the second group 103A is connected to the support member 170. Therefore, the light emitting cells A1 to An of the first group 101A are operated during the half operational period of the AC power and the light emitting cells B1 to Bn of the second group 103A are operated during the remaining half operational period of the AC power. Details of the operation have already been described in the first embodiment.

Figure 15:
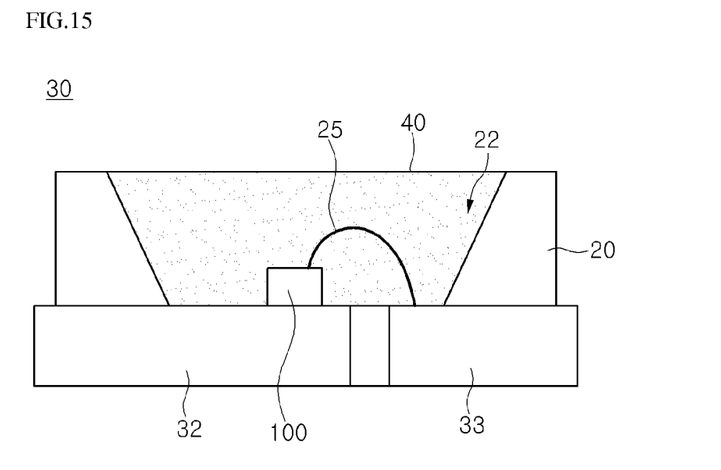
FIG. 15 is a sectional view showing a light emitting device package including a light emitting device shown in FIG. 1.

FIG. 15 is a sectional view showing a light emitting device package including the light emitting device according to the embodiment.

Referring to FIG. 15, the light emitting device package 30 includes a body 20, first and second lead electrodes 32 and 33 formed on the body 20, the light emitting device 100 provided on the body 20 and electrically connected to the first and second lead electrodes 32 and 33 and a molding member 40 that surrounds the light emitting device 100.

The body 20 may include at least one of silicon, synthetic resin, metal sapphire (Al2O3) and a PCB (printed circuit board). An inclined surface may be formed around the light emitting device 100. The body 20 may have a cavity 22, but the embodiment is not limited thereto.

The first and second lead electrodes 32 and 33 are electrically separated from each other to supply power to the light emitting device 100. In addition, the first and second lead electrodes 32 and 33 reflect the light emitted from the light emitting device 100 to improve the light efficiency and dissipate heat generated from the light emitting device 100 to the outside.

Although FIG. 15 shows the first and second lead electrodes 32 and 33 installed on the lower surface of the body 20, the embodiment is not limited thereto.

For instance, the first and second lead electrodes 32 and 33 can be provided on the body 20 and first and second pads can be formed on the lower surface of the body 20. In this case, the first and second lead electrodes 32 and 33 can be electrically connected to the first and second pads through first and second conductive via holes formed through the body 20.

The light emitting device 100 can be installed on the body 20 or the first and second lead electrodes 32 and 33.

The light emitting device 100 can be electrically connected to at least one of the first and second lead electrodes 32 and 33 through at least one wire 25. For instance, the first and second electrodes of the light emitting device 100 shown in FIG. 1 can be connected to the second lead electrode 33 through a wire, and the conductive support member of the light emitting device 100 can be formed on the first lead electrode 32 through the die bonding scheme. In addition, the light emitting device 100 can be electrically connected to the first and second lead electrodes 32 and 33 through the flip chip bonding scheme or the die bonding scheme. One of the light emitting devices according to the embodiments can be selectively used as the light emitting device 100, and the embodiment is not limited thereto.

The molding member 40 includes silicon or resin having transmissive property. The molding member 40 surrounds the light emitting device 100 to protect the light emitting device 100. In addition, the molding member 40 may include phosphors to change the wavelength of the light emitted from the light emitting device 100.

Although the top-view type light emitting device package is disclosed in the embodiment, the side-view type light emitting device package can be used to improve the heat dissipation, conductivity and reflective characteristics. According to the top-view type light emitting device package or the side-view type light emitting device package, the light emitting device is packaged by using the resin layer and then the lens is formed on or bonded to the resin layer, but the embodiment is not limited thereto.

The light emitting device 100 is packaged and installed on the substrate to provide the light emitting module, or the light emitting device is prepared in the form of the LED to provide the light emitting module.

The light emitting module of the light unit includes the light emitting device package. The light emitting device package has the structure as shown in FIG. 15. Otherwise, the light emitting device according to the embodiment is installed on the substrate and packaged by the molding member.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 16 and 17, a light unit shown in FIG. 18, in addition to a lighting lamp, a signal light, a vehicle headlight, an electronic display, etc.

Figure 16:
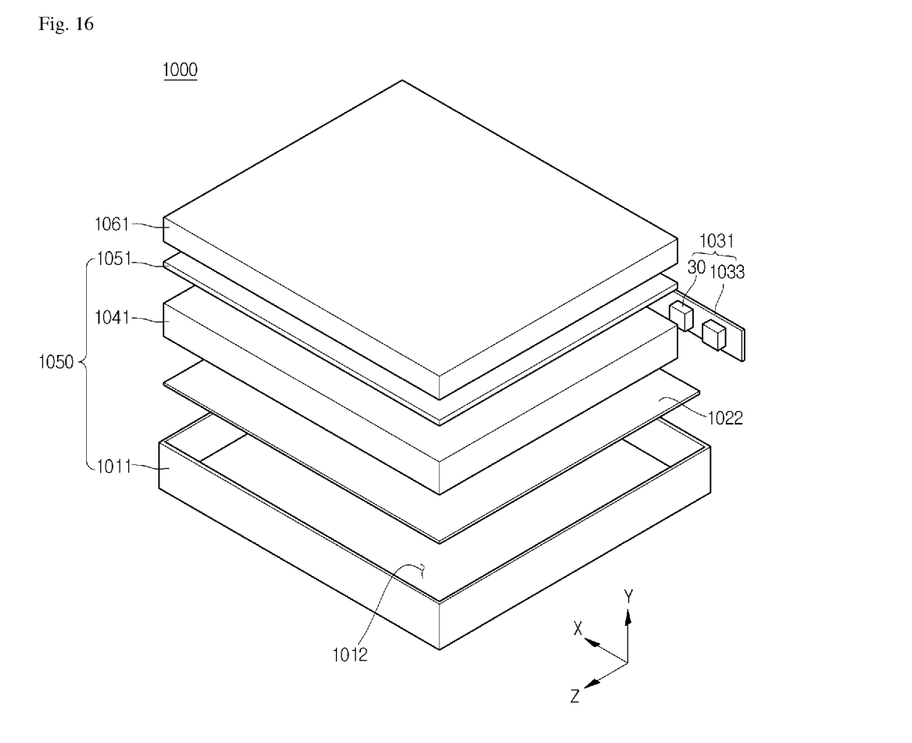
FIG. 16 is a perspective view illustrating an example of a display apparatus provided with the light emitting device package of FIG. 15.

FIG. 16 is a disassembled perspective view of a display apparatus according to an embodiment.

Referring to FIG. 16, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto.

The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 17:
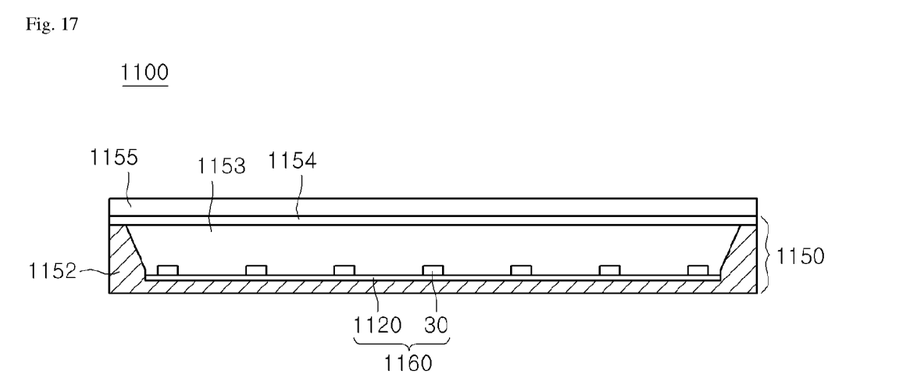
FIG. 17 is a perspective view illustrating another example of a display apparatus provided with the light emitting device package of FIG. 15.

FIG. 17 is a cross-sectional view of a display apparatus according to an embodiment.

Referring to FIG. 17, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed.

The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 18:
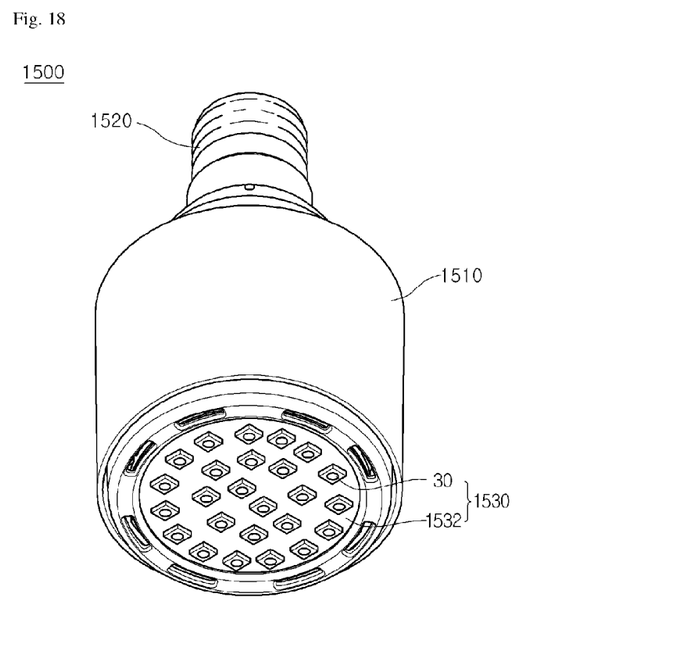
FIG. 18 is a perspective view of a lighting apparatus provided with the light emitting device package of FIG. 15.

FIG. 18 is a perspective view of a lighting unit according to an embodiment.

Referring to FIG. 18, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultra-violet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

The light emitting module of the light unit includes the light emitting device packages. The light emitting device package may have a package structure using the body, or may be prepared by mounting the light emitting devices disclosed above on the board and then packaging the light emitting devices using the molding member.

The method of manufacturing the light emitting device includes the steps of forming a first conductive semiconductor layer, an active layer and a second conductive semiconductor layer on a growth substrate; forming a plurality of ohmic contact layers on the second conductive semiconductor layer such that the ohmic contact layers are spaced apart from each other; forming m (m>4) recesses through an etching process to expose the first conductive semiconductor layer; forming a first insulating layer on the second conductive semiconductor layer and around the recesses, forming a second insulating layer except for a region where a central electrode layer is formed; forming a conductive support member on the second insulating layer and the central electrode layer; removing the substrate, exposing the second insulating layer through an etching process to provide m light emitting cells (m≥4), and connecting the m light emitting cells to each other in series; and forming a first electrode connected to the first conductive semiconductor layer of the first light emitting cell and a second electrode connected to an electrode layer disposed under the last light emitting cell.

The embodiment can provide the light emitting device driven under the AC power. The embodiment can drive the light emitting device used for the high-voltage AC power. The embodiment can provide the light emitting device having thermal stability. The embodiment can provide the light emitting apparatus operated under the AC power by connecting a plurality of light emitting devices having a plurality of serial light emitting cells in series, parallel or anti-parallel configuration.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a first group including a plurality of light emitting structures connected to each other in series and disposed on one side of the semiconductor light emitting device;
   a second group including a plurality of light emitting structures connected to each other in series and disposed on the other side of the semiconductor light emitting device;
   a first pad connected to a first light emitting structure of the first group of light emitting structures;
   a second pad connected to a first light emitting structure of the second group of light emitting structures;
   a first electrode layer to connect two adjacent light emitting structures of the plurality of light emitting structures of the first group in series, wherein the first electrode layer is disposed under the two adjacent light emitting structures of the plurality of light emitting structures of the first group, respectively;
   a second electrode layer to connect two adjacent light emitting structures of the plurality of light emitting structures of the second group in series, wherein the second electrode layer is disposed under the two adjacent light emitting structures of the plurality of light emitting structures of the second group, respectively;
   a third electrode layer to connect an anode terminal of the plurality of light emitting structures of the first group of light emitting structures and a cathode terminal of the plurality of the second group of light emitting structures;
   a conductive support member disposed under the plurality of light emitting structures of the first group and the plurality of light emitting structures of the second group, and connected electrically to the third electrode layer;
   a first insulating layer to insulate the first electrode layer, the second electrode layer and the third electrode layer from the plurality of light emitting structures of the first electrode layer group and the plurality of light emitting structures of the second group; and
   a second the insulating layer to insulate the first and second electrode layer from the conductive support member, wherein the second insulating layer is disposed on the conductive support member and is disposed under the first and second electrode layers,
   wherein each of the plurality of light emitting structures of the first group and the plurality of light emitting structures of the second group includes a first conductive type semiconductor layer, an active layer under the first conductive type semiconductor layer, and a second conductive type semiconductor layer under the active layer,
   wherein a part of the first electrode layer extends to an inner portion of the first conductive type semiconductor layer of the plurality of light emitting structures of the first group, and
   wherein a part of the second electrode layer extends to an inner portion of the first conductive type semiconductor layer of the plurality of light emitting structures of the first group.

2. The semiconductor light emitting device of claim 1, further comprising a fourth electrode layer having a first end connected to the first conductive type semiconductor layer of the first light emitting structure of the plurality of light emitting structures of the first group and a second end connected to the first pad.

3. The semiconductor light emitting device of claim 1, further comprising a fifth electrode layer having a first end electrically connected to a lower portion of the second conductive type semiconductor layer of the first light emitting structure of the plurality of light emitting structures of the second group and a second end connected to the second pad.

4. The semiconductor light emitting device of claim 1, further comprising a roughness pattern on a top surface of the first conductive type semiconductor layer.

5. The semiconductor light emitting device of claim 1, further comprising an ohmic contact layer including a first ohmic contact layer disposed between the plurality of light emitting structures of the first group and the first electrode layer, and a second ohmic contact layer between the plurality of light emitting structures of the second group and the second electrode layer.

6. The semiconductor light emitting device of claim 1, wherein a second power terminal having a second polarity is connected to the first and second pads, a first power terminal having a first polarity is connected to the conductive support member, the a plurality of light emitting structures of the first group emit light for a half period of AC power, and the plurality of light emitting structures of the second group emits light for a remaining half period of the AC power.

7. The semiconductor light emitting device of claim 1, wherein the first electrode layer, second electrode layer and third electrode layer each include one selected from the group consisting of Ag, Ni, Al, Rh, Pd, Ir, Ru, Mg, Zn, Pt, Au, Hf, W, Ti and a combination thereof.

8. The semiconductor light emitting device of claim 1, wherein each of the plurality of light emitting structures of the first group and the plurality of light emitting structures of the second group includes one of an N-P junction structure, a P-N junction structure, an N-P-N junction structure, and a P-N-P junction structure having a group III-V compound semiconductors.

9. The semiconductor light emitting device of claim 1, wherein the conductive support member includes at least one selected from the group consisting of Cu, Au, Ni, Mo, Cu—W, a carrier wafer, Pd, In, W, Si, Ta and Nb.

10. The semiconductor light emitting device of claim 1, wherein the first electrode layer, the second electrode layer, and the third electrode layer each include a reflective material.

11. The semiconductor light emitting device of claim 1,
wherein a third insulating layer is disposed around each of
the plurality of light emitting structures of the first group and the plurality of light emitting structures of the second group.

12. The semiconductor light emitting device of claim 1, wherein the first pad and the second pad are electrically connected to each other.

13. The semiconductor light emitting device of claim 1, wherein a number of the plurality of light emitting structures of the first group is identical to a number of the plurality of light emitting structures of the second group.

\* \* \* \* \*